(12) United States Patent
Chu et al.

(10) Patent No.: US 9,747,977 B2
(45) Date of Patent: Aug. 29, 2017

(54) METHODS AND SYSTEMS FOR VERIFYING CELL PROGRAMMING IN PHASE CHANGE MEMORY

(71) Applicants: Daniel J. Chu, Folsom, CA (US); Raymond W. Zeng, Sunnyvale, CA (US); Doyle Rivers, El Dorado Hills, CA (US)

(72) Inventors: Daniel J. Chu, Folsom, CA (US); Raymond W. Zeng, Sunnyvale, CA (US); Doyle Rivers, El Dorado Hills, CA (US)

(73) Assignee: INTEL CORPORATION, Santa Clara, CA (US)

( * ) Notice: Subject to any disclaimer, the term of this patent is extended or adjusted under 35 U.S.C. 154(b) by 475 days.

(21) Appl. No.: 13/827,825

(22) Filed: Mar. 14, 2013

(65) Prior Publication Data
US 2014/0269045 A1    Sep. 18, 2014

(51) Int. Cl.
*G11C 11/56* (2006.01)
*G11C 16/34* (2006.01)
(Continued)

(52) U.S. Cl.
CPC ...... *G11C 13/0004* (2013.01); *G11C 13/0033* (2013.01); *G11C 13/0064* (2013.01); *G11C 13/0069* (2013.01)

(58) Field of Classification Search
CPC ............ G11C 13/0004; G11C 13/0069; G11C 2013/0092; G11C 13/004; G11C 11/5678; G11C 16/3454; G11C 13/0064; G11C 16/3459; G11C 11/5628; G11C 16/10; G11C 2013/0076
See application file for complete search history.

(56) References Cited

U.S. PATENT DOCUMENTS 7,679,075 B2 * 3/2010 Chao ................... H01L 27/2409
257/4
7,796,438 B2 * 9/2010 Kim ...................... G11C 16/10
365/185.17

(Continued)

FOREIGN PATENT DOCUMENTS

JP         200454966 A       2/2004
KR    10-2012-0117793      10/2012

OTHER PUBLICATIONS

International Search Report and Written Opinion received for PCT Patent Application No. PCT/US2014/017941, mailed on May 26, 2014, 11 pages.

*Primary Examiner* — Hoai V Ho
*Assistant Examiner* — Roberto Mancera, Jr.
(74) *Attorney, Agent, or Firm* — Thorpe North & Western, LLP; David W. Osborne

(57) ABSTRACT

Technology for verifying cell programming for a phase change memory array is disclosed. In an example, a method may include sending a reset pulse to a phase change memory cell. The method may further include sensing a threshold voltage of the phase change memory cell in response to applying first and second verify voltages across the phase change memory cell, where the second verify voltage is lower than the first verify voltage. The method may also include determining whether the threshold voltage of the phase change memory cell was below the first or second verify voltages.

20 Claims, 4 Drawing Sheets

(51) Int. Cl.
*G11C 16/10* (2006.01)
*G11C 13/00* (2006.01)

(56) References Cited

U.S. PATENT DOCUMENTS

| | | | | |
|---|---|---|---|---|
| 8,120,967 | B2* | 2/2012 | Kang | G11C 11/5628 365/185.03 |
| 8,134,866 | B2* | 3/2012 | Bae | G11O 5/143 365/163 |
| 8,854,878 | B2* | 10/2014 | Honma | G11C 16/3427 365/185.02 |
| 2003/0151950 | A1* | 8/2003 | Tamada et al. | 365/185.19 |
| 2009/0040814 | A1 | 2/2009 | Kang et al. | |
| 2009/0141561 | A1* | 6/2009 | Yang et al. | 365/185.22 |
| 2009/0296466 | A1* | 12/2009 | Kim | G11C 11/5628 365/185.03 |
| 2010/0008133 | A1* | 1/2010 | Cho | G11C 8/10 365/163 |
| 2011/0075475 | A1 | 3/2011 | Lee | |
| 2011/0122683 | A1 | 5/2011 | Dodge et al. | |
| 2012/0273746 | A1* | 11/2012 | Agarwal | G11C 13/0004 257/4 |
| 2012/0287706 | A1 | 11/2012 | Lung | |
| 2012/0287730 | A1 | 11/2012 | Kim | |
| 2012/0320670 | A1* | 12/2012 | Kau | 365/163 |
| 2013/0051139 | A1* | 2/2013 | Dodge et al. | 365/163 |
| 2015/0070987 | A1* | 3/2015 | Kim | G11C 16/12 365/185.03 |

\* cited by examiner

METHODS AND SYSTEMS FOR VERIFYING CELL PROGRAMMING IN PHASE CHANGE MEMORY

TECHNICAL FIELD

Embodiments described herein relate generally to phase change memory.

BACKGROUND

Phase change memories use phase change materials to accomplish electronic data storage. Phase change materials can typically be electrically switched between generally amorphous and generally crystalline states. Some materials may be electrically switched to a number of detectible degrees or orders of crystallinity that fall on the spectrum bounded by completely amorphous and completely crystalline states. Typical materials suitable for such an application include various chalcogenide elements. One useful property of phase change materials is that they are non-volatile. When the memory is set in a specific state of crystallinity representing a resistance value, that value is retained until the memory is reprogrammed, even if power is removed. This is because the program value can be assigned to each phase or physical state of the material (e.g., crystalline or amorphous or some degree in between).

BRIEF DESCRIPTION OF THE DRAWINGS

Features and advantages of the disclosure will be apparent from the detailed description which follows, taken in conjunction with the accompanying drawings, which together illustrate, by way of example, features of the disclosure; and, wherein.

Figure 1:
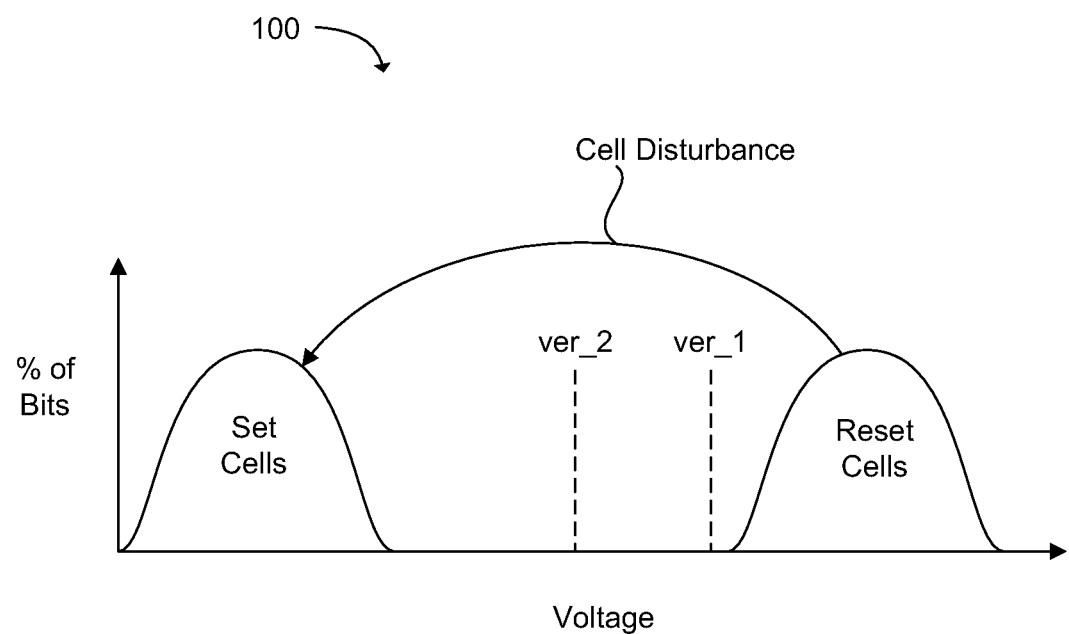
FIG. 1 illustrates a diagram or graph of set cell and reset cell threshold voltage distributions and relative first and second verify voltages in accordance with an example.

Reference will now be made to the exemplary embodiments illustrated, and specific language will be used herein to describe the same. It will nevertheless be understood that no limitation of the scope or to specific invention embodiments is thereby intended.

DESCRIPTION OF EMBODIMENTS

Before the invention embodiments are disclosed and described, it is to be understood that no limitation to the particular structures, process steps, or materials disclosed herein is intended, and that equivalents and alternatives thereof as would be recognized by those ordinarily skilled in the relevant arts are included. It should also be understood that terminology employed herein is used for the purpose of describing particular examples only and is not intended to be limiting. The same reference numerals in different drawings represent the same element. Numbers provided in flow charts and processes are provided for clarity in illustrating steps and operations and do not necessarily indicate a particular order or sequence.

Example Embodiments

An initial overview of various invention embodiments is provided below and then specific examples are described in further detail later. While this initial summary is intended to aid readers in understanding principles and embodiments of the present technology more quickly, it is not intended to identify key or essential features thereof. Nor is it intended to limit the scope of the claimed subject matter.

A failure mode has been observed in phase change memory cells where a cell may become disturbed by performing a verify operation using a voltage that is close to the cell's existing Vth (threshold voltage). When in a reset state, if the voltage of the verify operation is slightly below the Vth of the cell, the cell will pass the reset verification because the cell does not snap back. However, the verify operation itself can cause the cell Vth to drop down to a set state. Empirical data shows that this "disturbance" (i.e. drop to the set state or level) occurs randomly with low probability, but that the probability of such event increases exponentially as the voltage applied in the verify operation approaches the cell's existing Vth. Since the cell passes the verification but leaves the operation in a failing state, even a single verify operation may increase bit write errors. Doing a second verify operation may identify bits disturbed by the first verify operation, but can also have the possibility of disturbing the cell.

Embodiments of the present technology may perform two verify operations to improve data reliability and may avoid disturbing the data with the second verify operation. A reduction in write bit error rates may be obtained directly rather than by increasing the number of bits needed in order to improve the accuracy of the ECC (Error Correcting Code). Performing a second verify may be more time and energy efficient in terms of cost as compared with increasing a total number of bits to compensate for errors. Added circuitry required to perform a second verify operation may be negligible.

Referring now to FIG. 1, phase change memory may be susceptible to a disturbance during sensing of a reset (high threshold voltage) state. Phase change memory programming may include set and reset operations. A set operation may lower the Vth of a cell and a reset operation may raise the Vth of the cell. The desired Vth of the cell can be controlled by the current applied to the cell. The Vth, after sending a set or reset pulse to the cell, can be verified by performing a sensing operation on the cell. For example, in a reset verify operation, a voltage may be applied across the cell to see whether the cell snaps back (i.e., dramatically drops or lowers resistance). If it does, then the Vth is below this verify voltage. If the cell does not snap back, the Vth is above the verify voltage. The reset procedure can actively place a Vth by looping between pulsing and verifying, with the pulse current being increased on cells that have not passed the last verify operation.

In FIG. 1, a graph 100 is provided which illustrates a Vth for set cells and for reset cells, as well as an approximate verify voltage relative to the reset and set Vth distributions. After sending a reset pulse to a cell, the state of the cell can be verified by applying a first verify voltage (i.e. ver_1) across the cell. The ver_1 is the minimum allowed reset Vth. The minimum ver_1 is determined by the difference between the highest set cell Vth and lowest reset cell Vth that is needed in order to reliably read a cell. The highest reset Vth is limited by the risk of over-reset. If the reset pulse causes the Vth to go above the maximum voltage that can be applied across the cell, the cell will be over-reset. An over-reset cell may not be changed to a set state because the cell may not be selected to apply a set pulse to the cell. In this case, the cell may be "stuck" as a reset bit (i.e. in a perpetual reset state). To avoid over-reset, the reset pulse current profile may be designed to, on average, result in a Vth near the low end of the reset distribution. This may involve multiple reset pulses and verify pulses if the starting reset pulse current profile is insufficient to place all cells being reset above ver_1. The lower reset pulse Vth placement also increases the probability that a cell Vth is near the ver_1. More cells with a Vth close to ver_1 exponentially increases the probability of a Vth disturb event. Disturb events with a Vth above the ver_1 level will usually pass the first verify, indicating the cell has been properly reset. However, the cell may be disturbed after the verify status is determined. As an example, the state of the disturbed cell may change or lower the resistance to a set Vth. Such a disturbance may result in data errors.

Accordingly, a second verify voltage (i.e. ver_2) may be applied across the cell to verify whether the ver_1 disturbed the cell. The ver_2 may be lower than the ver_1 and may be higher than the set state Vth. Setting the ver_2 too close to the set state Vth may miss or overlook disturbed cells that only have their Vth reduced slightly. Setting the ver_2 close to the ver_1 may also increase a risk of disturbing the cell. As the ver_2 approaches the ver_1, the risk of disturbing the cell with the ver_2 may increase toward the probability that the ver_1 will disturb the cell. The maximum ver_2 may be chosen based on an acceptably low probability of disturbing a cell that is in the reset cell distribution (i.e. whose Vth is above ver_1). The minimum ver_2 may be chosen based on the lowest verify voltage that will catch an acceptable number of the cells disturbed by the ver_1 verify operation.

For example, the graph 100 of FIG. 1 illustrates Vth distributions of set cells and reset cells across a population of many cells. In one example, the ver_1 may be at the lowest Vth bit in the reset cell voltage distribution. The ver_2 may be set closer to a middle of the voltage difference between the set and reset cell Vth distributions. For example, where the difference between the distributions is defined at a lower bound by the upper end of the set Vth distribution and defined at an upper bound by the lower end of the Vth reset distribution, and a position within the difference is 0% at the lower bound and 100% at the upper bound, the position within the difference of the ver_2 may be in the range of 35-75%, or from 40-65%, or may be at approximately 50% of the difference. In this example, the upper and lower bounds of the distribution may include anywhere from 2-10% error to account for outlier cells with a state or voltage lying somewhere in between the set and reset cell distributions.

Because the ver_2 may be removed from the distribution of set cell voltages and the distribution of reset cell voltages, a probability of disturbance of reset cells may be low, a probability of identifying or verifying set cells as reset cells will be low, and a probability of failing to verify reset cells will be low. However, the ver_2 may also identify outlier cells as being reset. Certain embodiments of the present technology may evaluate whether a cell passed both the first and second verify voltages. Outlier cells may not pass the first verify voltage and disturbed cells may not pass the second verify voltage. Thus, the two verify voltages in combination may be used to significantly increase verification accuracy without significantly increasing disturbance probability. In one aspect, verification may be used for cells to which a reset pulse has been applied and may not be used on other cells, and thus there may be no bits that are verified which are intended to be set cells.

In some aspects, the ver_2 of the dual verify technology may be low enough that the probability of disturbing a reset cell is very low and ver_1 may be higher than a highest desired set Vth used to detect a disturbed cell. The higher the voltage of the ver_2, the more disturbed bits will be detected. An optimal value for the ver_2 level may be identified for a particular memory device by experimentation on Vth disturbance through sample device characterization.

Figure 2:
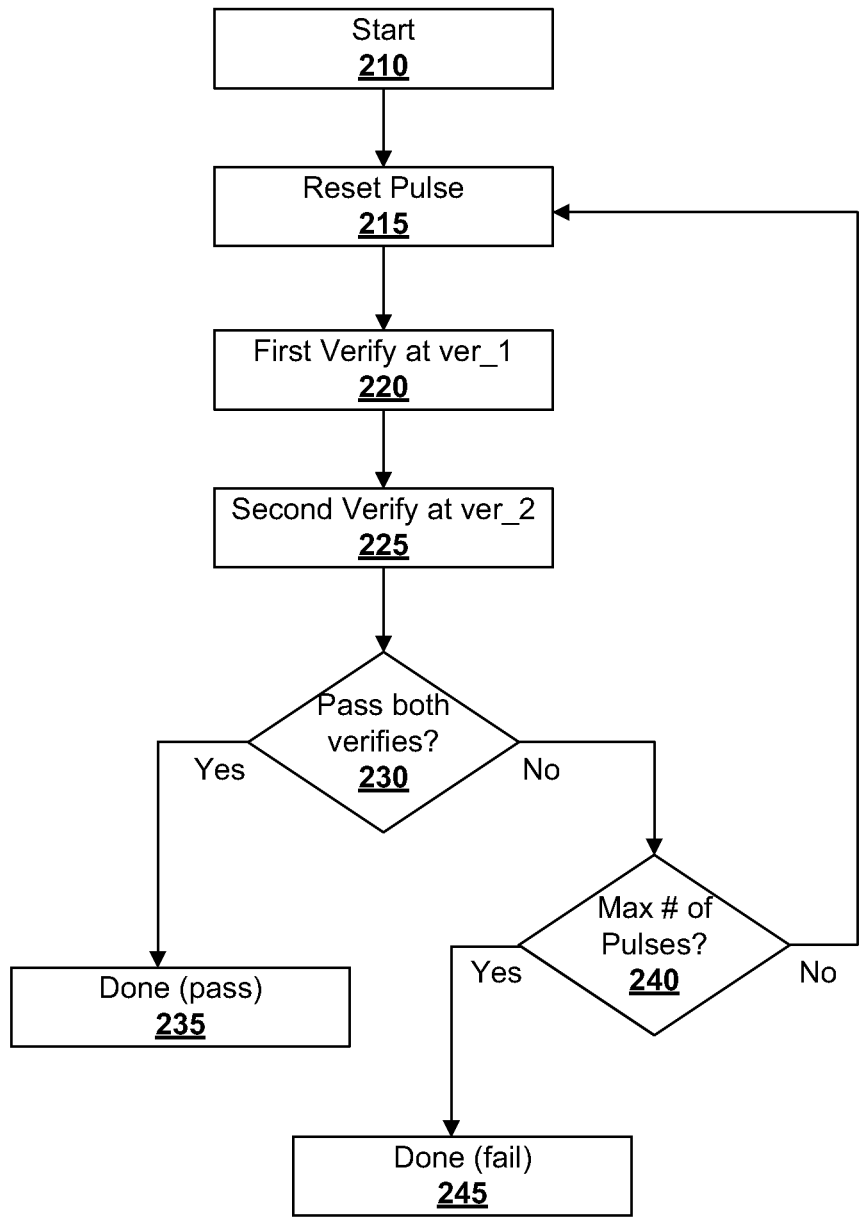
FIG. 2 illustrates a decision diagram of a dual verify reset programming method for verifying a reset and lack of disturb in a phase change memory cell in accordance with an example.

Referring to FIG. 2, a decision diagram is illustrated for verifying cell programming, or more specifically for verifying cell reset. A process may start 210 when a controller initiates a macro for sending a reset pulse 215 to a cell. The controller or a sense circuit may be used to perform the first verify operation at ver_1 220 and to subsequently perform the second verify operation at ver_2 225. A determination may be made as to whether the cell passed both verifies 230. If a cell fails either the first or second verify operations, the cell may be given another reset pulse 215. If the cell failed the first verify operation, the cell did not have a high enough Vth after the reset pulse. If the cell passed the first verify operation but failed the second verify operation, the cell was disturbed by the first verify operation. Without regard to whether the Vth was not high enough or the cell was disturbed by the first verify, the cell may be given the subsequent reset pulse 215 in an attempt to attain the desired reset Vth. A verify loop may be repeated until the write error rate is acceptably low. In other words, the process of sending a reset pulse to a cell and performing first and second verify operations on the cell may be repeated until a number of cells in an array have successfully passed the reset verification process and the number of failing cells is within an acceptably small margin of error, such as in a range of 2 to 20%. When the error rate is acceptably low, the reset verification process may be complete. For an individual cell, if both verifications pass, the process may be complete or done 235.

When the cell fails one or more of the verify operations, a determination may be made as to whether a maximum number of reset pulses has been applied to the cell 240. In other words, the reset verify process may repeat a number of times and then stop when a determination can be made that the cell is unlikely to pass the verification process. For example, a maximum number of pulses sent to a cell before identifying the cell as an error may be 20 or fewer pulses, or 10 or fewer pulses, or even 5 or fewer pulses. If the cell fails to pass both verification operations after a number of repetitions, the cell may be identified as an error and the verification process may be complete or done 245 as a fail for the cell.

As the verify loop repeats and a subsequent reset pulse is applied to a cell, a voltage or current of the reset pulse may be increased for each repetition. A repeated verify loop for a cell may be a single verify iteration. For subsequent verify loop iterations on the cell, the reset pulse may be initiated at a same starting reset pulse voltage or current as a previous iteration rather than continuing from an ending reset pulse voltage or current from the previous iteration.

To program a cell within a memory device, a write circuit may generate current or voltage pulses for heating a phase change material in the cell of the memory device. The amplitudes and durations of the one or more current or voltage pulses may differ depending on whether the memory cell is being set or reset. Generally, a "set" programming operation of a cell may involve heating the phase change material of the cell above a crystallization temperature of the phase change material without reaching or exceeding a melting temperature. The temperature is held for a duration sufficient to achieve a desired crystalline state, partially crystalline state or partially amorphous state. Generally, a "reset" programming operation of a cell may involve heating the phase change material of the cell above the melting temperature and then rapidly quench cooling the material to achieve a desired amorphous state, partially amorphous state or partially crystalline state.

A state of a phase change memory cell may be a function of resistivity. The state of the cell is alterable by locally heating the cell. Data retention for phase change memories may be specified for a time period at a specified temperature or within a suitable temperature range. Data retention may be a function of the crystallization temperature of the phase change material within the element. In some applications, the memory device may not be kept at a constant temperature and may experience various changes in temperature, which may reduce an effective period of data retention.

Significant changes in memory device temperature may negatively affect the memory device. For example, if an ambient temperature is raised, then read or verify operations may be more likely to disturb a cell by causing additional heating in the cell. Use of a second verify voltage that is significantly less than the first verify voltage, as has been described, may be unlikely to disturb the cell even during moderate temperature fluctuations.

A number of accumulated read or verify pulses may cause a partial setting of a cell. As a result, cell resistance and Vth may be lowered or reduced and additional verify pulses, particularly when close to a reset cell voltage in increased temperature surroundings, may increase a probability of disturbing the cell and placing the cell into the set state, resulting in a loss of data. Again, the second reduced verify voltage may have a minimal likelihood of disturbance with a high likelihood of detecting disturbance from the first verify.

In one embodiment, the phase change material used in the storage device may be suitable for non-volatile memory data storage. The phase change material may be a material having electrical properties (e.g., resistance) that may be changed through the application of energy such as, for example, heat, light, voltage potential, or electrical current.

Examples of phase change materials may include a chalcogenide material. A chalcogenide material may be a material that includes at least one element from column VI of the periodic table or may be a material that includes one or more of the chalcogen elements, e.g., any of the elements of tellurium, sulfur, or selenium. Chalcogenide materials may be non-volatile memory materials that may be used to store information that is retained even after electrical power is removed.

In one embodiment, the phase change material may be a chalcogenide element composition from the class of tellurium-germanium-antimony ($Te_xGe_ySb_z$) material or a GeSbTe alloy, such as type 2,2,5, although other suitable chalcogenide materials may be considered within the scope of the disclosure.

In one embodiment, if the memory material is a non-volatile, phase change material, the memory material may be programmed into one of at least two memory states by applying an electrical signal to the memory material. An electrical signal may alter the phase of the memory material between a substantially crystalline state and a substantially amorphous state, wherein the electrical resistance of the memory material in the substantially amorphous state is greater than the resistance of the memory material in the substantially crystalline state.

Programming of the memory material to alter the state or phase of the material may be accomplished in various ways. In one embodiment, programming can occur by selecting the cell using a voltage potential across the memory material. This can be accomplished by applying a relatively low voltage, such as zero volts, to the selected line, and a current into the selected column, from one current source to reset a cell to a higher resistance. Alternatively, another current source with a lower current or slower trailing edge to set to a lower resistance can be used. An electrical current may flow through a portion of the memory material in response to the applied voltage potentials, and may result in heating of the memory material.

The controlled heating and subsequent controlled cooling may alter the memory state or phase of the memory material. Altering the phase or state of the memory material may alter an electrical characteristic of the memory material. For example, resistance of the material may be altered by altering the phase of the memory material. Either all or a portion of the phase change memory material may be altered during the writing pulse. In one example, a portion of memory material that undergoes phase change may be a portion adjacent to an electrode that contacts the storage device and that is used for storing the bit. The memory material may be a programmable resistive material or simply a programmable resistance material.

In one embodiment, a voltage pulse with a potential difference of about 1.5 volts may be applied across a portion of the memory material by applying about 0 volts to a line and a current of about 2 mA from a write current source into a different selected line. For example, the voltage on one selected line relative to another selected line may be positive, or the cell or voltages may be reversed. A current flowing through the memory material in response to the applied voltage potentials may result in heating of the memory material. This heating and subsequent controlled cooling, determined by the write current pulse trailing edge rate, may alter the memory state or phase of the material after the memory material is cooled, from higher to lower resistance, from lower to higher resistance, or to rewrite the existing state to reinforce the existing state.

As one example, in a "reset" state, the memory material may be in an amorphous or semi-amorphous state and in a "set" state, the memory material may be in a crystalline or semi-crystalline state. The resistance of the memory material in the amorphous or semi-amorphous state may be greater than the resistance of the material in the crystalline or semi-crystalline state. The association of reset and set with amorphous and crystalline states, respectively, is a convention. Other conventions may be adopted.

The information stored in memory material may be read by measuring the resistance of the memory material. As an example, a read current may be provided to the memory material using the selected row and column and a resulting read voltage across the memory material may be compared against a reference voltage. The resulting read voltage on the column may be proportional to the resistance exhibited by the selected memory storage device when a read current is forced into the column.

Examples

The following examples pertain to further embodiments.

Figure 3:
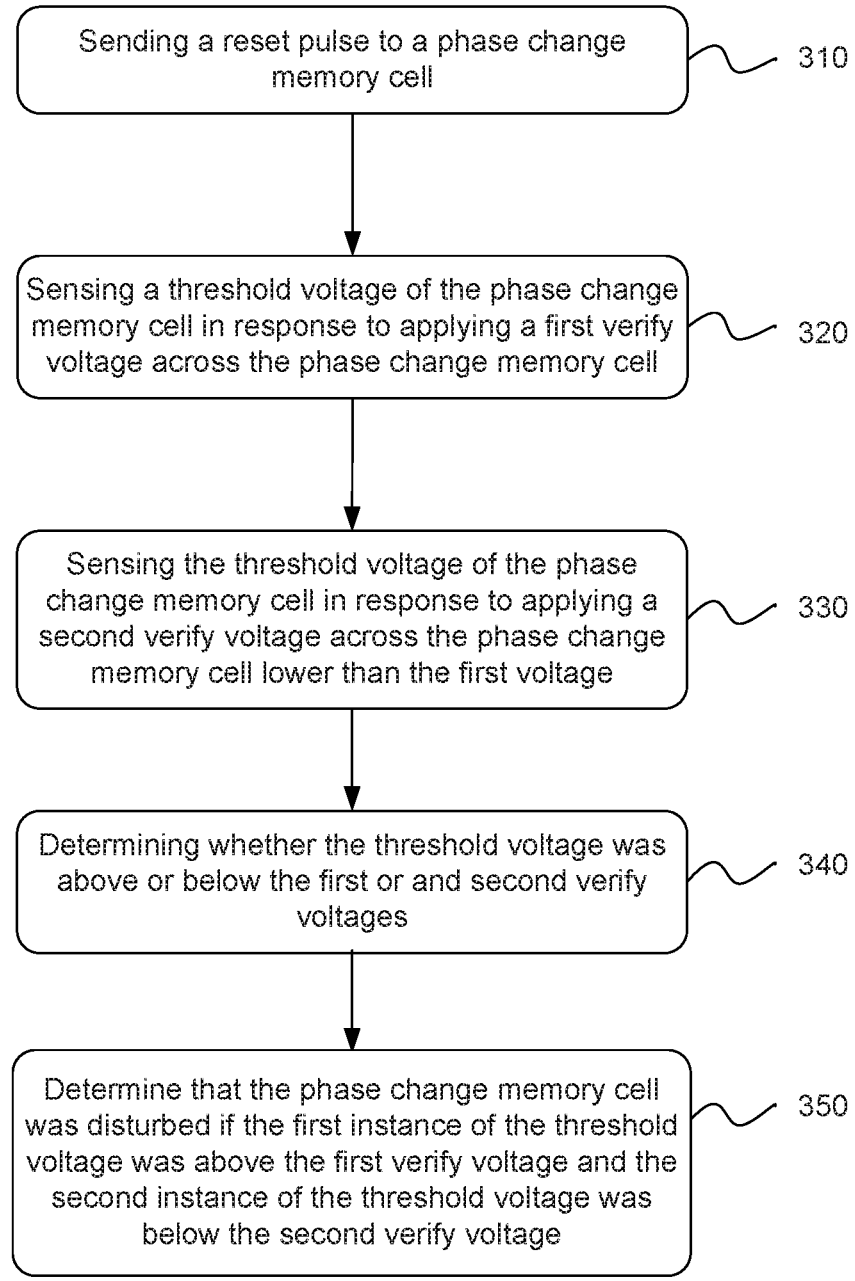
FIG. 3 illustrates a flow diagram of a method of verifying cell programming for phase change memory in accordance with an example.

With reference to FIG. 3, Example 1 is a flow diagram of a method for verifying cell programming or cell reset for a phase change memory device in accordance with an example of the present technology. The method may include sending 310 a reset pulse to a phase change memory cell followed by sensing 320 a threshold voltage of the phase change memory cell in response to applying a first verify voltage across the phase change memory cell. The method may further include sensing 330 the threshold voltage of the phase change memory cell in response to applying a second verify voltage across the phase change memory cell lower than the first voltage. The method may also include determining 340 whether the threshold voltage was below the first or second verify voltages.

In one example, the method of determining 340 whether the Vth of the phase change memory cell was below the first or second verify voltages may involve determining whether the phase change memory cell has a lowered resistance after application of the first or second verify voltages. In other words, a determination may be made as to whether the phase change memory cell "snapped back" or was disturbed as a result of the first verify voltage.

As has been described, in certain embodiments, the second verify voltage in the method may be higher than the highest set cell threshold voltage. Also, the first verify voltage may be lower than the lowest reset cell threshold voltage.

The method may include determining that the phase change memory cell was disturbed by the first verify voltage if the threshold voltage of the phase change memory cell was below the second verify voltage. The method may also include determining that the phase change memory cell was successfully reset when the threshold voltage of the phase change memory cell was above the first and second verify voltages.

In one example, the method may include selecting the second verify voltage such that a probability of disturbing the phase change memory cell is reduced by a predetermined amount or percentage as compared with a probability of disturbing the phase change memory cell using the first verify voltage. For example, the second verify voltage may be selected such that the probability of disturbing the phase change memory cell is reduced by 50% or 75% or 90% or 95% or 99% or a greater percentage as compared with a probability of disturbing the phase change memory cell using the first verify voltage.

In one example, the method may include repeating the processes of sending the reset pulse, sensing the threshold voltage of the phase change memory cell by applying the first and second verify voltages and determining whether the reset cell threshold voltage was below the first or second verify voltages. The repeating of the processes may be performed a predetermined number of times. A voltage or current of the reset pulse, the first verify voltage, or the second verify voltage may be increased with each repetition in an effort to achieve the desired reset cell voltage Vth.

Each repetition of the method may be an iteration in an overall policy or protocol. For example, the first repeat may be a first iteration. The method may thus perform the repeated sending, sensing and determining method processes for a second iteration subsequent to the first iteration. The second iteration may begin at original first and second verify voltages and increase the first and second verify voltages with each repetition in the second iteration. Likewise, a third iteration may begin at the original first and second verify voltages and increase the first and second verify voltages with each repetition in the third iteration, and so forth.

In one example, the method may include identifying the phase change memory cell as disturbed when the threshold voltage of the phase change memory cell is below the first or second verify voltages.

Features of the systems or apparatuses described previously or later may also be implemented with respect to the method or any processes described herein, and vice versa. Also, specifics in the examples may be used anywhere in one or more embodiments.

Figure 4:
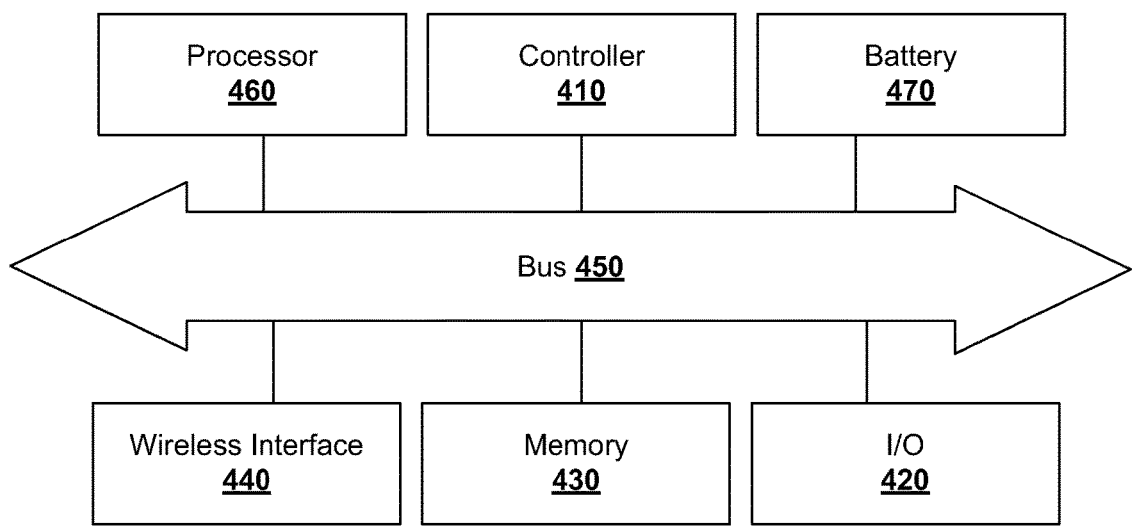
FIG. 4 illustrates a memory system diagram in accordance with an example.

In Example 2, and with reference to FIG. 4, a portion of a system 400 in accordance with an invention embodiment described. System 400 may be used in wireless or mobile devices such as, for example, a personal digital assistant (PDA), a laptop or portable computer with wireless capability, a web tablet, a smartphone or other wireless or cellular telephone, a pager, an instant messaging device, a digital music player, a digital camera, or other devices that may be adapted to transmit and/or receive information wirelessly. System 400 may be used in any of the following systems: a wireless local area network (WLAN) system, a wireless personal area network (WPAN) system, a cellular network. System 400 may also be used in other systems not specifically recited.

System 400 may include a controller 410, an input/output (I/O) device 420 (e.g. a keypad, display), a memory 430, and a wireless interface 440 coupled to each other via a bus 450. A battery 470 or other power source may be used in some embodiments. It should be noted that such components are merely exemplary and other components not specifically recited could be used in place of or included along with one or more of the above-recited components.

Controller 410 may comprise, for example, one or more microprocessors, digital signal processors, microcontrollers, or the like. Memory 430 may be used to store messages transmitted to or by system 400. Memory 430 may also optionally be used to store instructions that are executed by controller 410 during the operation of system 400, and may be used to store user data. Memory 430 may be provided by one or more different types of memory. For example, memory 430 may comprise any type of random access memory, a volatile memory, a non-volatile memory such as a flash memory and/or a memory such as memory discussed herein.

I/O device 420 may be used by a user to generate a message. System 400 may use wireless interface 440 to transmit and receive messages to and from a wireless communication network with a radio frequency (RF) signal. Examples of wireless interface 440 may include an antenna or a wireless transceiver or other signal transmitting/receiving devices.

In one example, the system 400 may include the processor 460, the power source or battery 470, and a phase change memory 430 coupled to the processor 460 and including an array of cells. In one example, the phase change memory may be a device having a chalcogenic material. The controller 410 may be a sequence controller configured to send read or write signals to the array of cells. In one example, the controller 410 may include a reset verify circuit or the reset verify circuit may be part of or associated with the memory 430.

The reset verify circuit may be adapted to send a reset pulse to at least one cell in the array of cells in the memory 430. The reset verify circuit may sense a threshold voltage of the at least one cell in response to applying a first verify voltage across the at least one cell, and may further sense a reset threshold voltage of the at least one cell in response to applying a second verify voltage across the at least one cell. The reset verify circuit may then determine whether the threshold voltage of the at least one cell was below the first or second verify voltages. The reset verify circuit may identify an error when the threshold voltage of the phase change memory cell is below the first or second verify voltages.

In this system, the second verify voltage may be different than the first verify voltage. More specifically, the second verify voltage may be lower than the first verify voltage. In one example system, the second verify voltage may be higher than a set cell threshold voltage and the first verify voltage may be lower than a reset cell threshold voltage.

The reset verify circuit may determine whether the reset voltage was below the first or second voltages by using logic to determine whether the phase change memory cell has a lowered resistance after application of the first or second verify voltages.

The reset verify circuit may operate cyclically when the cell threshold voltage is below the first or second verify voltages. In a more specific example, the reset verify circuit may operate a predetermined number of times when the cell Vth is below the first or second verify voltages. The reset verify circuit may raise a voltage or current of the reset pulse or it may raise the first verify voltage and/or the second verify voltage for each cyclical operation for the at least one cell. Once a cell has been verified and a subsequent verify operation has begun, the result pulse and/or verify voltages may be applied at original levels and again raised for each cyclical operation.

In Example 3, an embodiment of the present technology may simply provide a phase change memory. The phase change memory may include a reset verify circuit or the reset verify circuit may be part of or associated with the memory. The reset verify circuit may be adapted to send a reset pulse to at least one cell in the array of cells in the memory. The reset verify circuit may sense a threshold voltage of the at least one cell in response to applying a first verify voltage across the at least one cell, and may further sense a reset cell threshold voltage of the at least one cell in response to applying a second verify voltage across the at least one cell. The reset verify circuit may then determine whether the threshold voltage of the at least one cell was below the first or second verify voltages. The reset verify circuit may identify an error when the threshold voltage of the phase change memory cell is below the first or second verify voltages.

Various techniques, or certain aspects or portions thereof, may take the form of program code (i.e., instructions) embodied in tangible media, such as floppy diskettes, CD-ROMs, hard drives, non-transitory computer readable storage media, or any other machine-readable storage medium wherein, when the program code is loaded into and executed by a machine, such as a computer, the machine becomes an apparatus for practicing the various techniques. Circuitry can include hardware, firmware, program code, executable code, computer instructions, and/or software. A non-transitory computer readable storage medium can be a computer readable storage medium that does not include signal. In the case of program code execution on programmable computers, the computing device may include a processor, a storage medium readable by the processor (including volatile and non-volatile memory and/or storage elements), at least one input device, and at least one output device. The volatile and non-volatile memory and/or storage elements may be a RAM, EPROM, flash drive, optical drive, magnetic hard drive, solid state drive, or other medium for storing electronic data. The node and wireless device may also include a transceiver module, a counter module, a processing module, and/or a clock module or timer module. One or more programs that may implement or utilize the various techniques described herein may use an application programming interface (API), reusable controls, and the like. Such programs may be implemented in a high level procedural or object oriented programming language to communicate with a computer system. However, the program(s) may be implemented in assembly or machine language, if desired. In any case, the language may be a compiled or interpreted language, and may be combined with hardware implementations.

It should be understood that many of the functional units described in this specification have been labeled as modules, in order to more particularly emphasize their implementation independence. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices or the like.

Modules may also be implemented in software for execution by various types of processors. An identified module of executable code may, for instance, comprise one or more physical or logical blocks of computer instructions, which may, for instance, be organized as an object, procedure, or function. Nevertheless, the executables of an identified module need not be physically located together, but may comprise disparate instructions stored in different locations which, when joined logically together, comprise the module and achieve the stated purpose for the module.

Indeed, a module of executable code may be a single instruction, or many instructions, and may even be distributed over several different code segments, among different programs, and across several memory devices. Similarly, operational data may be identified and illustrated herein within modules, and may be embodied in any suitable form and organized within any suitable type of data structure. The operational data may be collected as a single data set, or may be distributed over different locations including over different storage devices, and may exist, at least partially, merely as electronic signals on a system or network. The modules may be passive or active, including agents operable to perform desired functions.

Reference throughout this specification to "an example" means that a particular feature, structure, or characteristic described in connection with the example is included in at least one invention embodiment. Thus, appearances of the phrases "in an example" in various places throughout this specification are not necessarily all referring to the same embodiment.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary. In addition, various invention embodiments and examples may be referred to herein along with alternatives for the various components thereof. It is understood that such embodiments, examples, and alternatives are not to be construed as defacto equivalents of one another, but are to be considered as separate and autonomous.

Furthermore, the described features, structures, or characteristics may be combined in any suitable manner in one or more embodiments. In this description, numerous specific details are provided, such as examples of layouts, distances, network examples, etc. One skilled in the relevant art will recognize, however, that many variations are possible without one or more of the specific details, or with other methods, components, layouts, measurements, etc. In other instances, well-known structures, materials, or operations are not shown or described in detail but are considered well within the scope of the disclosure.

While the forgoing examples are illustrative of the specific embodiments in one or more particular applications, it will be apparent to those of ordinary skill in the art that numerous modifications in form, usage and details of implementation can be made without departing from the principles and concepts articulated herein. Accordingly, no limitation is intended except as by the claims set forth below.

What is claimed is:

1. A method of verifying cell programming for phase change memory, comprising:
   sending a reset pulse to a phase change memory cell;
   sensing a first instance of a threshold voltage of the phase change memory cell in response to applying a first verify voltage across the phase change memory cell;
   sensing a second instance of the threshold voltage of the phase change memory cell in response to applying a second verify voltage across the phase change memory cell where the second verify voltage is lower than the first verify voltage;
   determining whether the first instance of the threshold voltage of the phase change memory cell was above the first verify voltage and the second instance of the threshold voltage of the phase change memory cell was below the second verify voltage; and
   determining that the phase change memory cell was disturbed by the first verify voltage if the first instance of the threshold voltage of the phase change memory was above the first verify voltage and the second instance of the threshold voltage of the phase change memory cell was below the second verify voltage.

2. The method of claim 1, wherein determining whether the first instance of the threshold voltage of the phase change memory cell was above the first verify voltage and the second instance of the threshold voltage was below the second verify voltage comprises determining whether the phase change memory cell has a lowered resistance after application of the first or second verify voltages.

3. The method of claim 1, wherein the second verify voltage is higher than a set cell threshold voltage.

4. The method of claim 1, wherein the first verify voltage is lower than a reset cell threshold voltage.

5. The method of claim 1, further comprising determining that the phase change memory cell was successfully reset when the first and second instance of the threshold voltage of the phase change memory cell was above the first and second verify voltages.

6. The method of claim 1, wherein the phase change memory cell includes a chalcogenic material.

7. The method of claim 6, wherein the chalcogenic material is a an amorphous or semi-amorphous state when in a reset state and a crystalline or semi-crystalline state when in a set state.

8. The method of claim 6, wherein sending a reset pulse to a phase change memory cell involves heating the chalcogenic material.

9. The method of claim 1, further comprising cyclically performing, a predetermined number of times, sending the reset pulse, sensing the first instance of the threshold voltage, sensing the second instance of the threshold voltage, and determining whether the first instance of the threshold voltage of the phase change memory cell was above the first verify voltage and the second instance of the threshold voltage of the phase change memory cell was below the second verify voltage.

10. The method of claim 9, wherein a voltage or current of the reset pulse raises for each cyclical operation of sending the reset pulse, sensing the first instance of the threshold voltage, sensing the second instance of the threshold voltage, and determining whether the first instance of the threshold voltage of the phase change memory cell was above the first verify voltage and the second instance of the threshold voltage of the phase change memory cell was below the second verify voltage.

11. A method of verifying cell programming for phase change memory, comprising:
    sending a first reset pulse to a phase change memory cell;
    sensing a first instance of a threshold voltage of the phase change memory cell in response to applying a first verify voltage across the phase change memory cell;
    selecting a second verify voltage such that a probability of disturbing the phase change memory cell is reduced by a predetermined amount as compared with a probability of disturbing the phase change memory cell using the first verify voltage;
    sensing a second instance of the threshold voltage of the phase change memory cell in response to applying the second verify voltage across the phase change memory cell where the second verify voltage is lower than the first verify voltage;
    determining whether the first instance of the threshold voltage of the phase change memory cell was above the first verify voltage and the second instance of the threshold voltage of the phase change memory cell was below the second verify voltage.

12. The method of claim 11, further comprising determining that the phase change memory cell was disturbed if the first instance of the threshold voltage was above the first verify voltage and the second instance of the threshold voltage was below the second verify voltage.

13. The method of claim 12, further comprising determining that the phase change memory cell was successfully reset when the first and second instance of the threshold voltage of the phase change memory cell was above the first and second verify voltages.

14. The method of claim 12, further comprising:
    determining that the phase change memory cell was not successfully reset when the first or second instance of the threshold voltage of the phase change memory cells was not above the first and second verify voltages;
    sending a second reset pulse to a phase change memory cell, wherein a voltage or current of the second reset pulse is greater than a voltage or current of the first rest pulse if the phase change memory cell was not successfully reset;

sensing a third instance of a threshold voltage of the phase change memory cell in response to applying the first verify voltage across the phase change memory cell;

sensing a forth instance of the threshold voltage of the phase change memory cell in response to applying the second verify voltage across the phase change memory cell where the second verify voltage is lower than the first verify voltage;

determining whether the third instance of the threshold voltage of the phase change memory cell was above the first verify voltage and the fourth instance of the threshold voltage of the phase change memory cell was below the second verify voltage.

15. The method of claim 14, further comprising determining that the phase change memory cell was disturbed by the third verify voltage if the first instance of the threshold voltage of the phase change memory was above the first verify voltage and the fourth instance of the threshold voltage of the phase change memory cell was below the second verify voltage.

16. The method of claim 15, further comprising determining that the phase change memory cell was successfully reset when the third and fourth instance of the threshold voltage of the phase change memory cell was above the first and second verify voltages.

17. The method of claim 15, further comprising determining that the phase change memory cell was not successfully reset when the third and fourth instance of the threshold voltage of the phase change memory cells was not above the first and second verify voltages.

18. The method of claim 11, wherein the second verify voltage is higher than a set cell threshold voltage.

19. The method of claim 11, wherein the first verify voltage is lower than a reset cell threshold voltage.

20. The method of claim 11, wherein determining whether the first instance of the threshold voltage of the phase change memory cell was above the first verify voltage and the second instance of the threshold voltage of the phase change memory cell was below the second verify voltage includes determining whether the phase change memory cell has a lowered resistance after application of the first or second verify voltages.

* * * * *